(12) United States Patent
Kurozaki et al.

(10) Patent No.: US 10,582,648 B2
(45) Date of Patent: Mar. 3, 2020

(54) POWER CONVERTER INCLUDING COMPONENT COMPARTMENT AND PARTITION WITH AIRFLOW OPENINGS

(71) Applicant: Fuji Electric Co., Ltd., Kanagawa (JP)

(72) Inventors: Tomo Kurozaki, Hyogo (JP); Keita Koshii, Hyogo (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/213,323

(22) Filed: Dec. 7, 2018

(65) Prior Publication Data

US 2019/0230825 A1 Jul. 25, 2019

(30) Foreign Application Priority Data

Jan. 25, 2018 (JP) .................. 2018-010429

(51) Int. Cl.
*H05K 7/20* (2006.01)
*H02M 7/00* (2006.01)

(52) U.S. Cl.
CPC ........ *H05K 7/20909* (2013.01); *H02M 7/003* (2013.01); *H05K 7/20145* (2013.01); *H05K 7/20154* (2013.01)

(58) Field of Classification Search
CPC . H05K 7/2089–20918; H05K 7/20136–20163
USPC ........ 361/695–697, 679.48–679.51; 454/184
See application file for complete search history.

(56) References Cited

U.S. PATENT DOCUMENTS

| | | | | |
|---|---|---|---|---|
| 6,678,156 | B2 * | 1/2004 | Moizer | H05K 7/20572 312/236 |
| 7,173,509 | B2 * | 2/2007 | Kumano | C23C 18/02 336/233 |
| 7,508,663 | B2 * | 3/2009 | Coglitore | H05K 7/20736 165/122 |
| 10,015,914 | B2 * | 7/2018 | Biragoni | H05K 7/20909 |
| 2015/0305197 | A1 * | 10/2015 | King | H05K 7/207 361/695 |
| 2015/0373872 | A1 * | 12/2015 | Khandelwal | H05K 7/20572 361/695 |
| 2017/0084516 | A1 | 3/2017 | Harada | |

FOREIGN PATENT DOCUMENTS

JP 2016-19324 A 2/2016
JP 2018-26969 A 2/2018

* cited by examiner

*Primary Examiner* — Zachary Pape
(74) *Attorney, Agent, or Firm* — Chen Yoshimura LLP

(57) ABSTRACT

A power converter includes a component compartment in which heat-generating components are housed, a duct for exhausting heat generated by the heat-generating components away from the component compartment, and a partition arranged between the component compartment and the duct in order to divide apart the component compartment and the duct. Outlets having sizes corresponding to the amounts of heat generated by the heat-generating components are formed in the partition.

7 Claims, 8 Drawing Sheets

POWER CONVERTER INCLUDING COMPONENT COMPARTMENT AND PARTITION WITH AIRFLOW OPENINGS

BACKGROUND OF THE INVENTION

Technical Field

The present invention relates to a power converter, and more particularly to a power converter including a component compartment which houses heat-generating components.

Background Art

Power converters that include a component compartment which houses heat-generating components are conventionally well-known (see Patent Document 1, for example).

The uninterruptible power supply (power converter) disclosed in Patent Document 1 includes a rectangular chassis, a cooling fan arranged on the top surface of the chassis, and a partition (partitioning member) which divides the space positioned below the cooling fan into a first space (a component compartment) and a second space (a duct) and has formed therein an opening which allows cooling air generated by the cooling fan to pass through from the first space into the second space. The uninterruptible power supply disclosed in Patent Document 1 further includes a semiconductor unit (heat-generating component) which includes an electrical circuit including switching devices. This semiconductor unit is arranged in the first space and is cooled by the cooling air generated by the cooling fan. Moreover, a slitted plate which adjusts the flow rate of the cooling air for cooling the semiconductor unit is installed in the opening in the partition.

In the uninterruptible power supply disclosed in Patent Document 1, the flow rate of the cooling air for cooling the semiconductor unit is adjusted by adjusting the aperture ratio of the slitted plate. Moreover, in the uninterruptible power supply disclosed in Patent Document 1, the aperture ratio of the slitted plate is adjusted by changing the number or size of a large number of slits formed distributed over the entire surface of the slitted plate.

RELATED ART DOCUMENTS

Patent Documents

Patent Document 1: Japanese Patent Application Laid-Open Publication No. 2016-19324

SUMMARY OF THE INVENTION

However, in the power converter disclosed in Patent Document 1, adjusting the cooling air flow rate (that is, the amount of air per unit time) to appropriately cool the semiconductor unit (heat-generating component) requires providing the slitted plate of a particular aperture ratio separately from the partitioning member. Therefore, in the power converter disclosed in Patent Document 1, providing the slitted plate to appropriately cool the heat-generating component results in an associated increase in the number of components as well as an increase in the complexity of the configuration of the device. In particular, when there are multiple heat-generating components, a slitted plate must be provided for each of these heat-generating components, and therefore the number of components increases significantly and the complexity of the configuration of the device increases significantly as well.

The present invention was made to solve the abovementioned problems, and one object of the present invention is to provide a power converter which makes it possible to appropriately cool heat-generating components while avoiding both an increase in the number of components and an increase in the complexity of the configuration of the device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a power converter including: a component compartment housing a plurality of heat-generating components; a duct communicating with the component compartment for exhausting heat generated by the heat-generating components; and a partition arranged between the component compartment and the duct, dividing apart the component compartment and the duct, the partition having a plurality of openings corresponding to the plurality of heat-generating components, respectively, so as to provide air passages from the corresponding heat-generating components to the duct, wherein areas of the openings in the partition correspond to amounts of heat generated by the corresponding heat-generating components, respectively, and wherein at least two of the plurality of heat-generating components have different heat generation amounts from each other, and the areas of the corresponding openings for said at least two of the plurality of heat-generating components are mutually different in accordance with said different heat generation amounts.

As described above, the power converter according to this aspect of the present invention includes the partition in which the opening of a size corresponding to the amount of heat generated by the heat-generating component is formed. Here, configuring the size of the opening formed in the partition so as to correspond to the amount of heat generated by the heat-generating component makes it possible to adjust the flow rate of the cooling air (that is, the amount of air per unit time) that flows from the component compartment to the duct. As a result, the flow rate of the cooling air that cools the heat-generating component can be appropriately set using just the opening formed in the partition, rather than having to provide a member for adjusting the cooling air flow rate separate from the partition. This makes it possible to appropriately cool the heat-generating component while avoiding both an increase in the number of components and an increase in the complexity of the configuration of the device. Moreover, the cooling air flow rate can be adjusted by adjusting the size of the opening itself that is formed in the partition, and therefore the size of the opening can be adjusted using a process that is relatively simple in comparison to changing the number and size of a large number of slits formed in a slitted plate.

In the power converter according to the aspect described above, the plurality of heat-generating components may include a power conversion unit and a reactor, and the area of the opening corresponding to the power conversion unit may be different from the area of the opening corresponding to the reactor. In this configuration, the area of the opening corresponding to the power conversion unit and the area of the opening corresponding to the reactor are different, and therefore the power conversion unit and the reactor (which typically generate different amounts of heat) can each be appropriately cooled in accordance with the amounts of heat generated thereby.

In this case, the plurality of heat-generating components may include a converter and an inverter, the converter may include first switching devices, the inverter may include second switching devices, the inverter may generate less heat than the converter, and the area of the opening corresponding to the inverter may be less than the area of the opening corresponding to the converter. In this configuration, the area of the opening corresponding to the second switching device is less than the area of the opening corresponding to the first switching device, and therefore the first switching device and the second switching device that generates less heat than the first switching device can each be appropriately cooled in accordance with the amounts of heat generated thereby.

In the configuration described above in which the plurality of heat-generating components include the inverter and the converter, the plurality of heat-generating components may further include a first reactor for the converter and a second reactor for the inverter, and the area of the opening corresponding to the second reactor may be less than the area of the opening corresponding to the first reactor. In this configuration, the amounts of heat generated by the first reactor for the converter and the second reactor for the inverter respectively correspond to the amounts of heat generated by the first switching device and the second switching device. In other words, the amount of heat generated by the second reactor is less than the amount of heat generated by the first reactor. Thus, by setting the area of the opening corresponding to the second reactor to be less than the area of the opening corresponding to the first reactor, the first reactor and the second reactor that generates less heat than the first reactor can each be appropriately cooled in accordance with the amounts of heat generated thereby.

In the configuration described above in which the plurality of heat-generating components include the first reactor and the second reactor, the converter and the inverter may be arranged side by side in a horizontal direction in the component compartment, the opening corresponding to the converter and the opening corresponding to the inverter may be formed in the partition so as to be arranged side by side in the horizontal direction at positions respectively corresponding to the converter and the inverter, the first reactor and the second reactor may be arranged side by side in the horizontal direction in the component compartment, and the opening corresponding to the first reactor and the opening corresponding to the second reactor may be formed in the partition so as to be arranged side by side in the horizontal direction at positions respectively corresponding to the first reactor and the second reactor. This configuration makes it possible to arrange the openings corresponding to the first switching device and the second switching device (which generate relatively similar amounts of heat) to be side by side in the horizontal direction in the partition, and similarly makes it possible to arrange the openings corresponding to the first reactor and the second reactor (which generate relatively similar amounts of heat) to be side by side in the horizontal direction in the partition. This, in turn, makes it possible to use a relatively simple process to form the openings in the partition.

In the configuration described above in which the plurality of heat-generating components include the inverter and the converter, the converter may further include a first radiating fin unit for radiating away heat generated by the first switching devices, the inverter may further include a second radiating fin unit for radiating away the heat generated by the second switching devices, the first radiating fin unit and the second radiating fin unit may be shorter in a horizontal direction than in a vertical direction when viewed from a side of the partition, and the opening corresponding to the converter may have a shape corresponding to a shape of the first radiating fin unit and the opening corresponding to the inverter may have a shape corresponding to a shape of the second radiating fin unit. In this configuration, the first radiating fin unit and the opening corresponding to the first switching device are both formed to be shorter in the horizontal direction than in the vertical direction, which makes it possible to make the first radiating fin unit and the opening corresponding to the first switching device overlap (that is, to expose the first radiating fin unit from the opening corresponding to the first switching device) when viewed from the side of the opening corresponding to the first switching device after the converter including the first radiating fin unit is housed in the component compartment. Similarly, the second radiating fin unit and the opening corresponding to the second switching device are both formed to be shorter in the horizontal direction than in the vertical direction, which makes it possible to make the second radiating fin unit and the opening corresponding to the second switching device overlap (that is, to expose the second radiating fin unit from the opening corresponding to the second switching device) when viewed from the side of the opening corresponding to the second switching device after the inverter including the second radiating fin unit is housed in the component compartment. Therefore, cooling air that has cooled the first radiating fin unit and cooling air that has cooled the second radiating fin unit both take linear flow paths through the component compartment and arrive at the duct in a linear manner. As a result, the flow of the cooling air that has cooled the first radiating fin unit and the flow of the cooling air that has cooled the second radiating fin unit are less likely to get obstructed, which makes it possible to cool the first switching device and the second switching device efficiently.

In the configuration described above in which the plurality of heat-generating components include the reactor, the reactor may include a core unit and a coil, at least one portion of the coil being exposed from the core unit, and the opening corresponding to the reactor may overlap with the exposed portion of the coil when viewed from a side of the partition. In this configuration, the exposed portion of the coil (which takes a relatively high temperature) in the reactor and the opening corresponding to the reactor are linearly aligned going from the component compartment towards the duct, and therefore cooling air that has cooled the reactor takes a linear flow path through the component compartment before arriving at the duct. As a result, the flow of the cooling air that has cooled the reactor is less likely to get obstructed, which makes it possible to cool the reactor efficiently.

In the configuration described above in which the plurality of heat-generating components include the first reactor and the second reactor, each of the first and second reactors may include a core unit and a coil, at least one portion of the coil being exposed from the core unit, and the openings corresponding to the first and second reactors may overlap with the respective exposed portions of the coils when viewed from a side of the partition.

In the configuration described above in which the heat-generating components include the reactor, the configuration may further comprise an air-guiding member that is arranged between the reactor and the opening corresponding to the reactor in order to guide cooling air from the reactor towards the corresponding opening. In this configuration, even when the reactor is arranged separated from the partition (opening) in order to maintain an insulation distance for the reactor, cooling air that has cooled the reactor can be easily guided to the opening by the air-guiding member.

In the configuration described above in which the plurality of heat-generating components include the first reactor and the second reactor, the configuration may further comprise an air-guiding member that is arranged between each of the first and second reactors and the corresponding opening in order to guide cooling air from the first and second reactors towards the corresponding openings, respectively.

In the configuration described above in which the heat-generating components include the power conversion unit, the power conversion unit may have a housing that is in contact with the partition. In this configuration, by sliding the power conversion unit into the component compartment until the housing of the power conversion unit contacts the partition, the positioning of the power conversion unit is determined by the partition. Thus, the power conversion unit can be positioned within the component compartment without having to provide a separate member for positioning the power conversion unit within the component compartment, thereby making it possible to avoid an increase in the number of components.

In the configuration described above in which the plurality of heat-generating components include the inverter and the converter, each of the inverter and the converter may have a housing that is in contact with the partition.

In the configuration described above in which the plurality of heat-generating components include the first reactor and the second reactor, the area of the opening corresponding to the first reactor may be less than the area of the opening corresponding to the inverter.

The present invention as described above makes it possible to, in a power converter, appropriately cool heat-generating components while avoiding both an increase in the number of components and an increase in the complexity of the configuration of the device.

It is to be understood that both the foregoing general description and the following detailed description are exemplary and explanatory, and are intended to provide further explanation of the invention as claimed.

DETAILED DESCRIPTION OF EMBODIMENTS

Specific embodiments of the present invention will be described below with reference to figures.

First, the overall configuration of a power converter 100 according to one embodiment of the present invention will be described with reference to FIGS. 1 to 8. This power converter 100 is a device for converting power, such as an uninterruptible power supply (UPS) or power conditioning system (PCS) for use in a data center or the like, for example.

In the present specification, the left-right direction, front-back direction, and up-down direction of a chassis 10 are respectively designated to be the X direction, Y direction, and Z direction. Moreover, the left direction, right direction, front direction (front side), rear direction (back side), up direction (top side) and down direction (bottom side) of the chassis 10 are respectively designated to be the X1 direction, X2 direction, Y1 direction, Y2 direction, Z1 direction, and Z2 direction.

Figure 1:
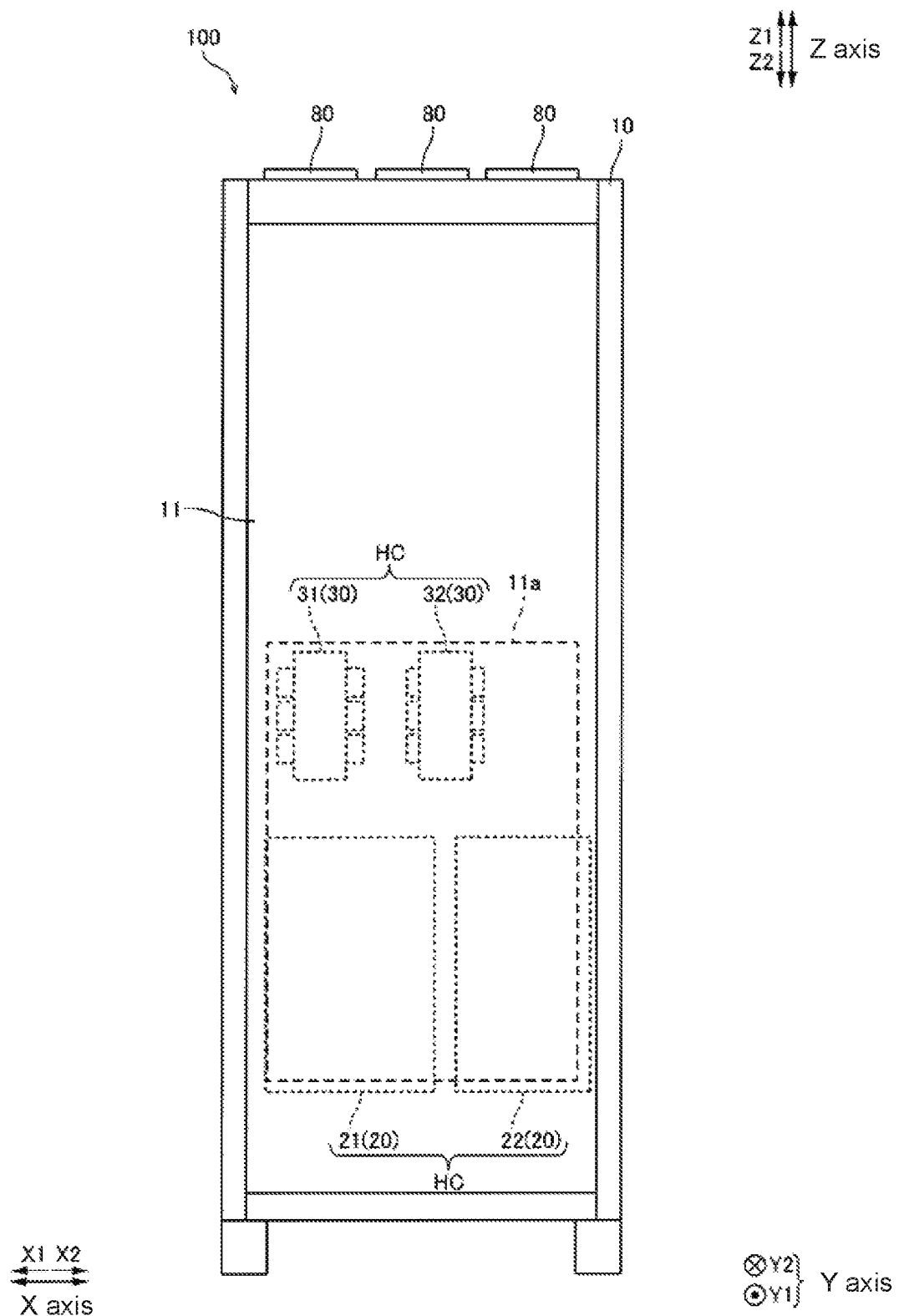
FIG. 1 is a front view illustrating the overall configuration of a power converter according to an embodiment of the present invention.

As illustrated in FIG. 1, the power converter 100 is configured to be a cubicle-type device. In other words, the power converter 100 includes a box-shaped metal chassis 10. The chassis 10 houses electronic devices such as a power conversion unit 20 and reactors 30. The power conversion unit 20 includes switching devices 20a (see FIG. 2) which form a power conversion circuit. Here, the power conversion unit 20 and the reactors 30 are examples of a "heat-generating component".

Figure 2:
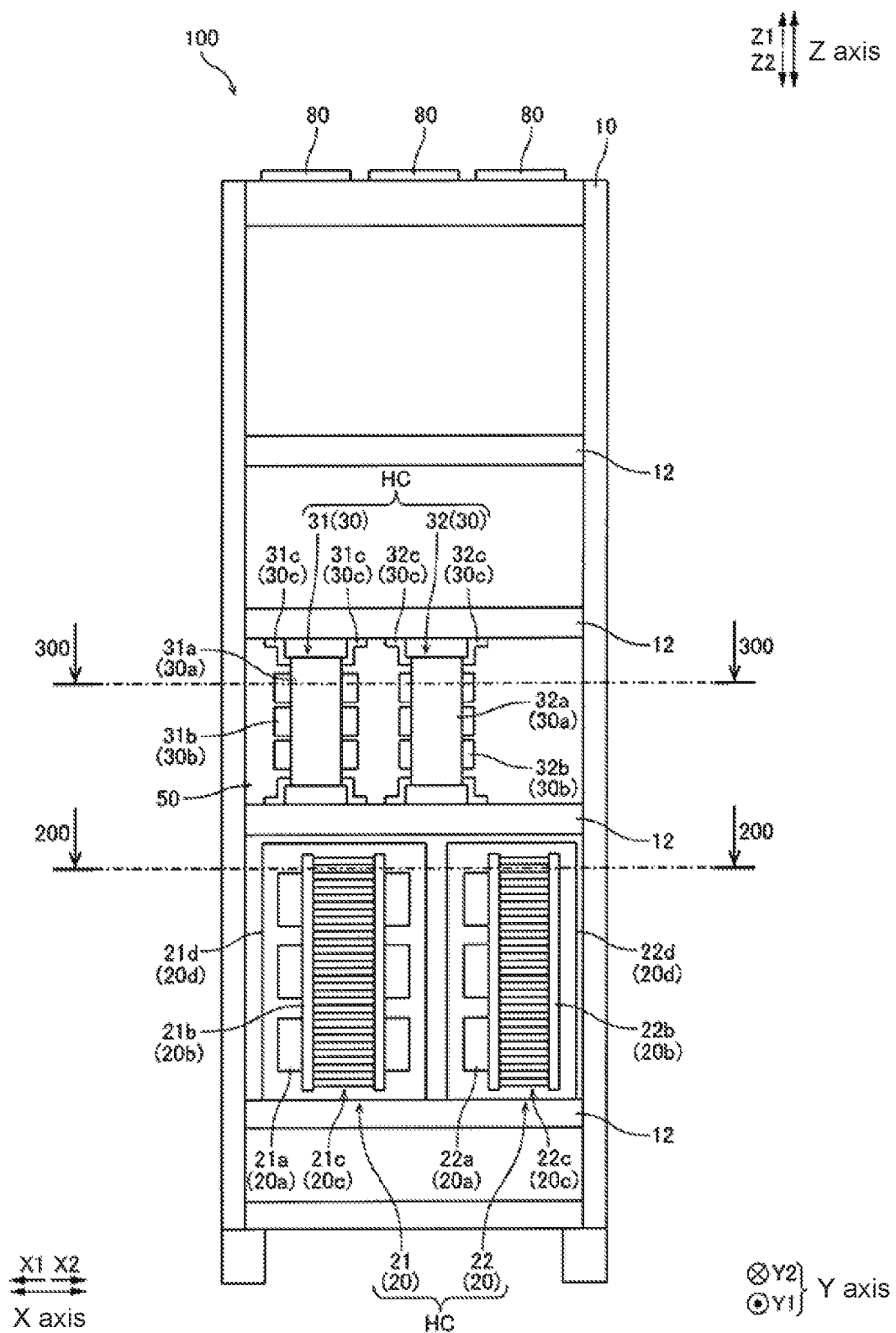
FIG. 2 is a front view illustrating the interior configuration of the power converter according to the embodiment of the present invention with a front panel removed.

As illustrated in FIG. 2, the power conversion unit 20 includes a converter 21 and an inverter 22. Moreover, the reactors 30 include a reactor 31 for the converter 21 and a reactor 32 for the inverter 22. Here, the reactor 31 and the reactor 32 are respectively examples of a "first reactor" and a "second reactor".

In addition to the switching devices 20a, the power conversion unit 20 includes heat radiating plate 20b on which the switching devices 20a are installed, radiating fin units 20c which are connected to the heat radiating plates 20b and radiate away heat generated by the switching devices 20a, and housings 20d which house the components of the power conversion unit 20. More specifically, the converter 21 includes a switching device 21a, a heat radiating plate 21b, a radiating fin unit 21c, and a housing 21d. Moreover, the inverter 22 includes a switching device 22a, a heat radiating plate 22b, a radiating fin unit 22c, and a housing 22d which houses the components of the inverter 22. Here, the switching device 21a and the switching device 22a are respectively examples of a "first switching device" and a "second switching device". Moreover, the radiating fin unit 21c and the radiating fin unit 22c are respectively examples of a "first radiating fin unit" and a "second radiating fin unit".

Figure 3:
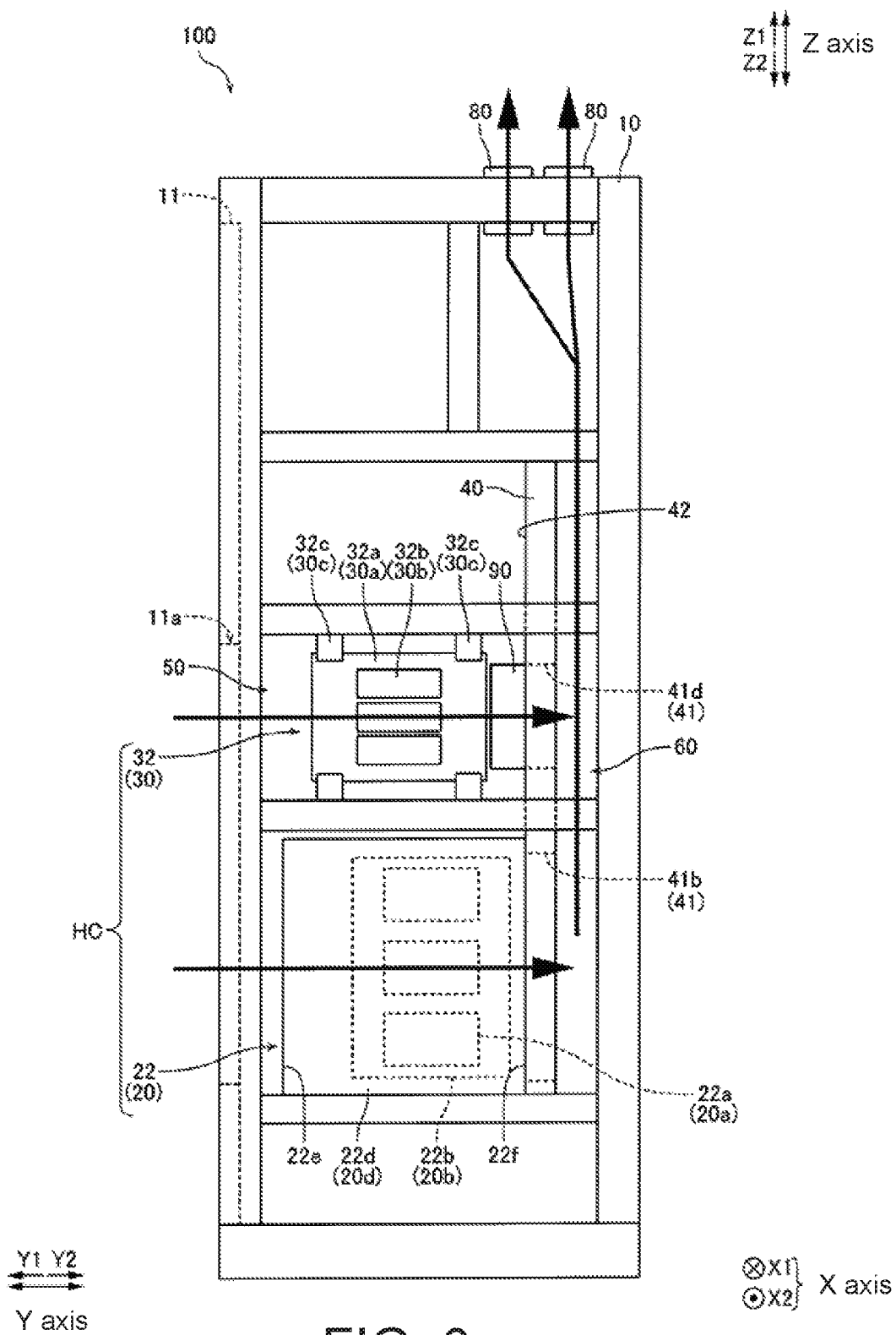
FIG. 3 is a side view illustrating the interior configuration of the power converter according to the embodiment of the present invention with a side cover removed.
Figure 6:
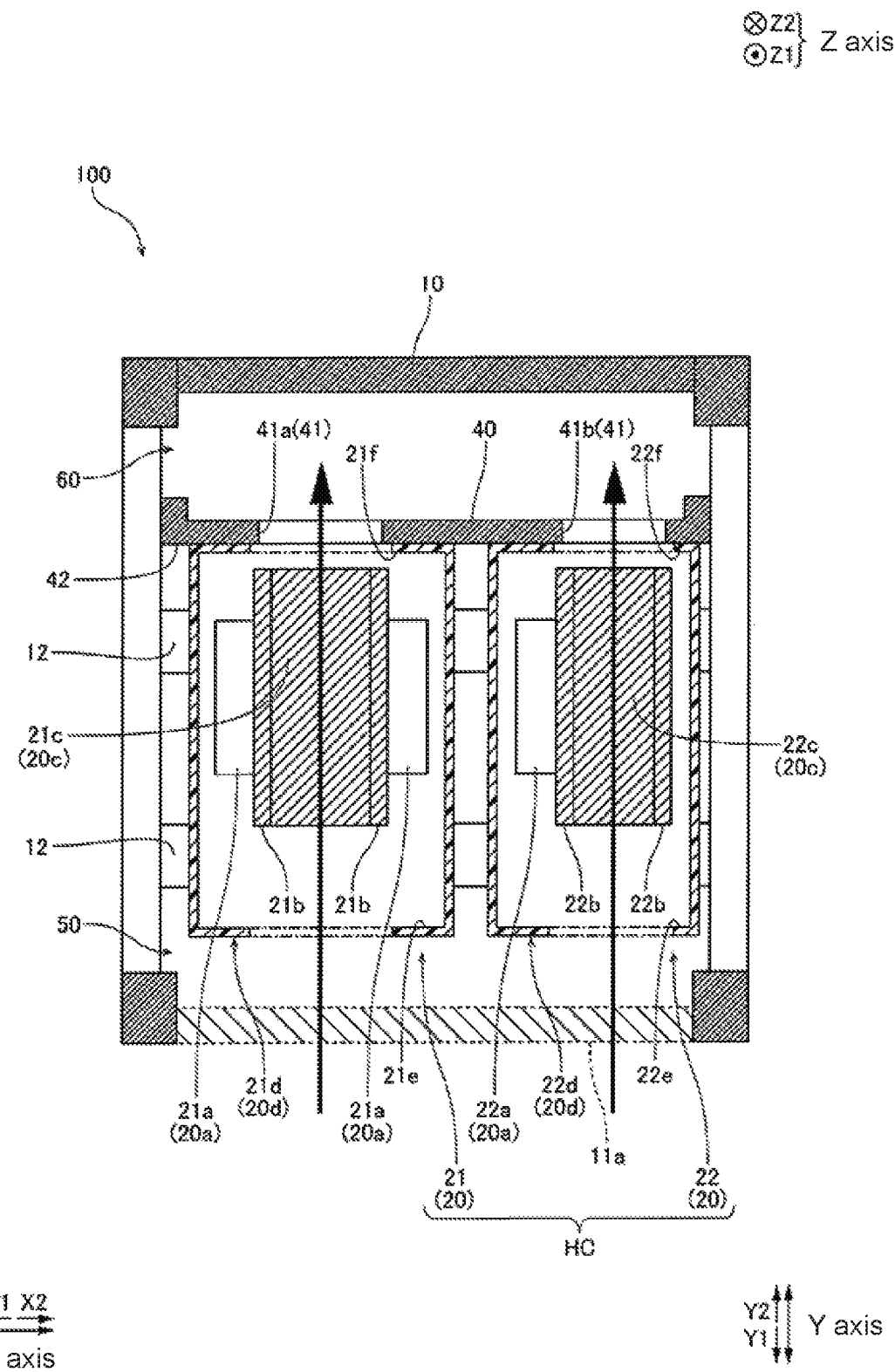
FIG. 6 is a cross-sectional view taken along line 200-200 in FIG. 2.

Furthermore, as illustrated in FIG. 3, in the housings 20d the front-side (Y1-side) faces and the back-side (Y2-side) faces are configured such that air can pass through in the front-back direction (Y direction) of the chassis 10. More specifically, as illustrated in FIG. 6, openings are formed in a front-side (Y1-side) face 21e and a back-side (Y2-side)

face 21f of the housing 21d. Similarly, openings are formed in a front-side (Y1-side) face 22e and a back-side (Y2-side) face 22f of the housing 22d.

As illustrated in FIG. 2, the reactors 30 include core units 30a in which cores are housed, coils 30b which are formed wound around rod-shaped portions of the cores, and mounting legs 30c for fixing the core units 30a to beams 12 arranged within the chassis 10. More specifically, the reactor 31 includes a core unit 31a, a coil 31b, and mounting legs 31c. Moreover, the reactor 32 includes a core unit 32a, a coil 32b, and mounting legs 32c. Here, the coils 30b are partially exposed from the core units 30a.

Here, the present embodiment is configured such that the amount of heat generated by the switching device 22a included in the inverter 22 is less than the amount of heat generated by the switching device 21a included in the converter 21, and such that the amount of heat generated by the reactor 32 is less than the amount of heat generated by the reactor 31. In other words, the power converter 100 is configured such that the amounts of heat generated by these heat-generating components HC are respectively associated, in order from smallest to largest, with the reactor 32, the reactor 31, the inverter 22, and the converter 21.

As illustrated in FIG. 3, in the present embodiment the power converter 100 includes a component compartment 50 in which the heat-generating components HC such as the power conversion unit 20 and the reactors 30 are housed as well as a duct 60 for exhausting heat generated by the heat-generating components HC from the component compartment 50. The power converter 100 further includes a partition 40 which is arranged between the component compartment 50 and the duct 60 in order to divide apart the component compartment 50 and the duct 60. Here, the partition 40 is an example of a "partition".

Figure 7:
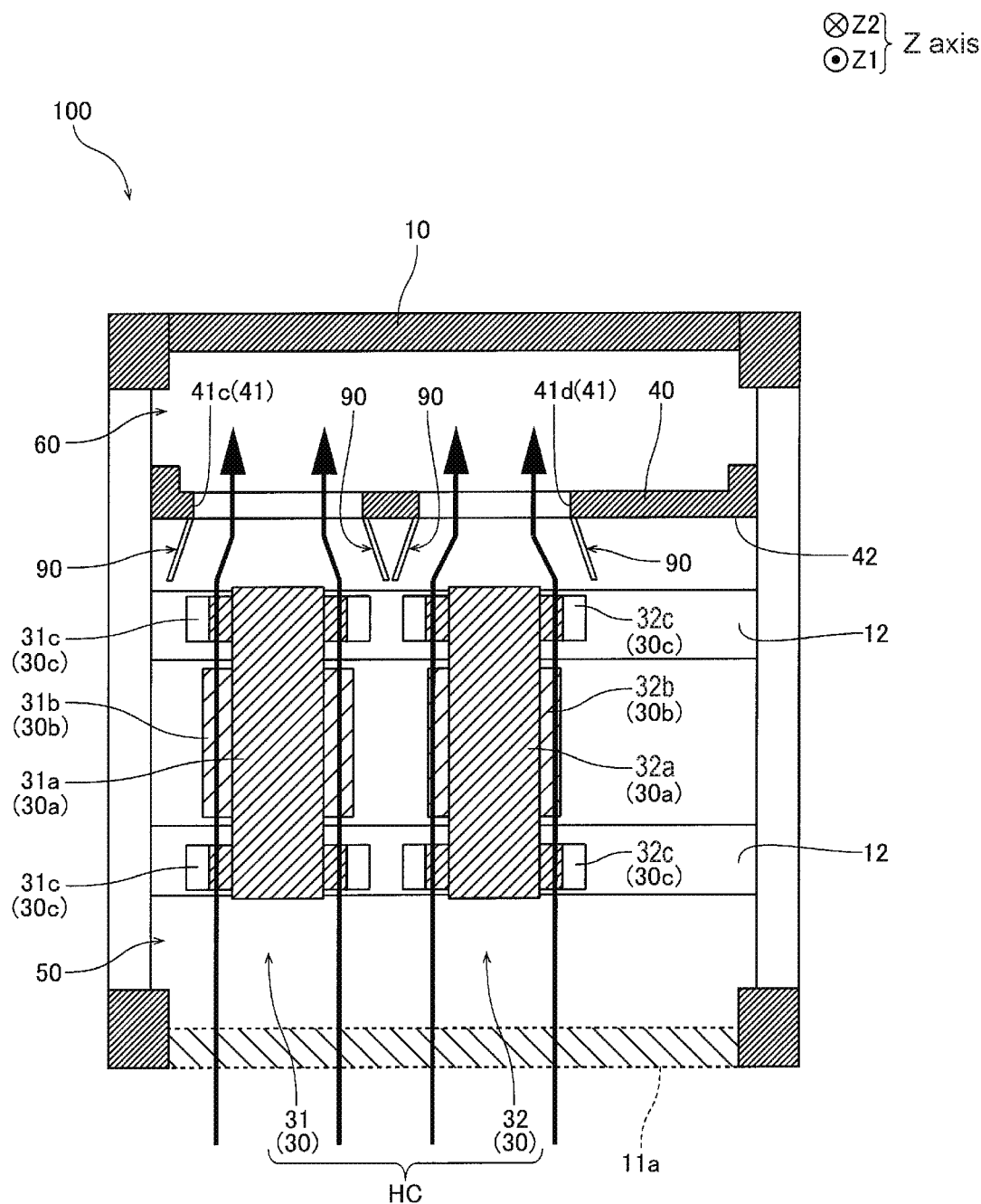
FIG. 7 is a cross-sectional view taken along line 300-300 in FIG. 2.

More specifically, in the power converter 100, the partition 40 is arranged so as to divide the interior of the chassis 10 into a front side (Y1 side) and a back side (Y2 side). As illustrated in FIGS. 6 and 7, the partition 40 has a shape that is bent at the respective lateral edges when viewed from the up-down direction (Z direction), and as illustrated in FIG. 3, the partition 40 is arranged extending in the up-down direction (Z direction). Moreover, on the front side (Y1 side) of the partition 40, a space is formed to serve as the component compartment 50 for housing electronic devices or the like including the heat-generating components HC. Furthermore, on the back side (Y2 side) of the partition 40, the duct 60 is formed extending in the up-down direction (Z direction). Outlets 41 for spatially connecting the component compartment 50 and the duct 60 are formed in the partition 40. Here, the outlets 41 are examples of "openings".

In the power converter 100, an openable/closable front panel 11 is formed on the front side (Y1 side) of the component compartment 50 so as to make the electronic devices and the like housed within the component compartment 50 accessible to a worker. The front panel 11 includes an opening region 11a configured so as to allow airflow between the exterior of the chassis 10 and the component compartment 50. In the opening region 11a, a large number of air holes are formed constituted by perforated metal or a metal mesh or the like, for example.

Moreover, in the power converter 100, fans 80 for giving the interior of the chassis 10 a negative pressure relative to the external environment are arranged near the top of the duct 60. Operating the fans 80 makes it possible to draw air from outside of the chassis 10 into the component compartment 50 via the opening region 11a, which is configured to allow air to pass therethrough. Furthermore, the air drawn into the component compartment 50 cools the electronic devices or the like including the heat-generating components HC and then passes through the outlets 41 and reaches the duct 60. The air that reaches the duct 60 is then exhausted back outside of the chassis 10 by the fans 80.

In the present embodiment, the outlets 41 have sizes corresponding to the amounts of heat generated by the heat-generating components HC. In particular, a plurality of outlets 41 are formed, and the sizes thereof are adjusted for each of the heat-generating components HC in a manner corresponding to the amounts of heat generated by those heat-generating components HC.

Figure 4:
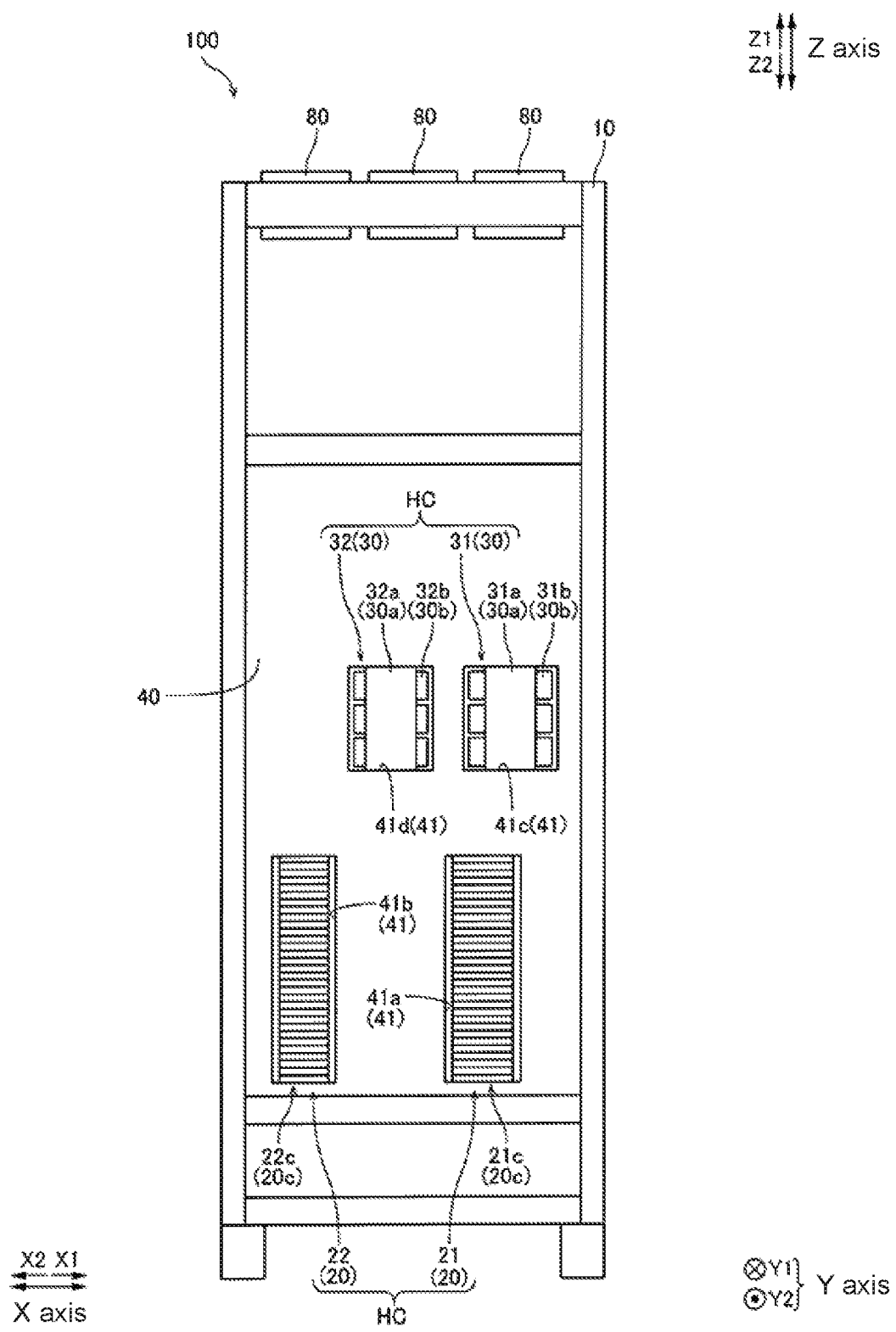
FIG. 4 is a rear view illustrating the interior configuration of the power converter according to the embodiment of the present invention with a back cover removed.

More specifically, as illustrated in FIG. 4, an outlet 41a, an outlet 41b, an outlet 41c, and an outlet 41d are formed in the partition 40 so as to respectively correspond to the switching device 21a included in the converter 21, the switching device 22a included in the inverter 22, the reactor 31, and the reactor 32. Moreover, the plurality of outlets 41 are configured such that the areas thereof take the following order from largest to smallest: outlet 41a, outlet 41b, outlet 41c, and outlet 41d.

Figure 5:
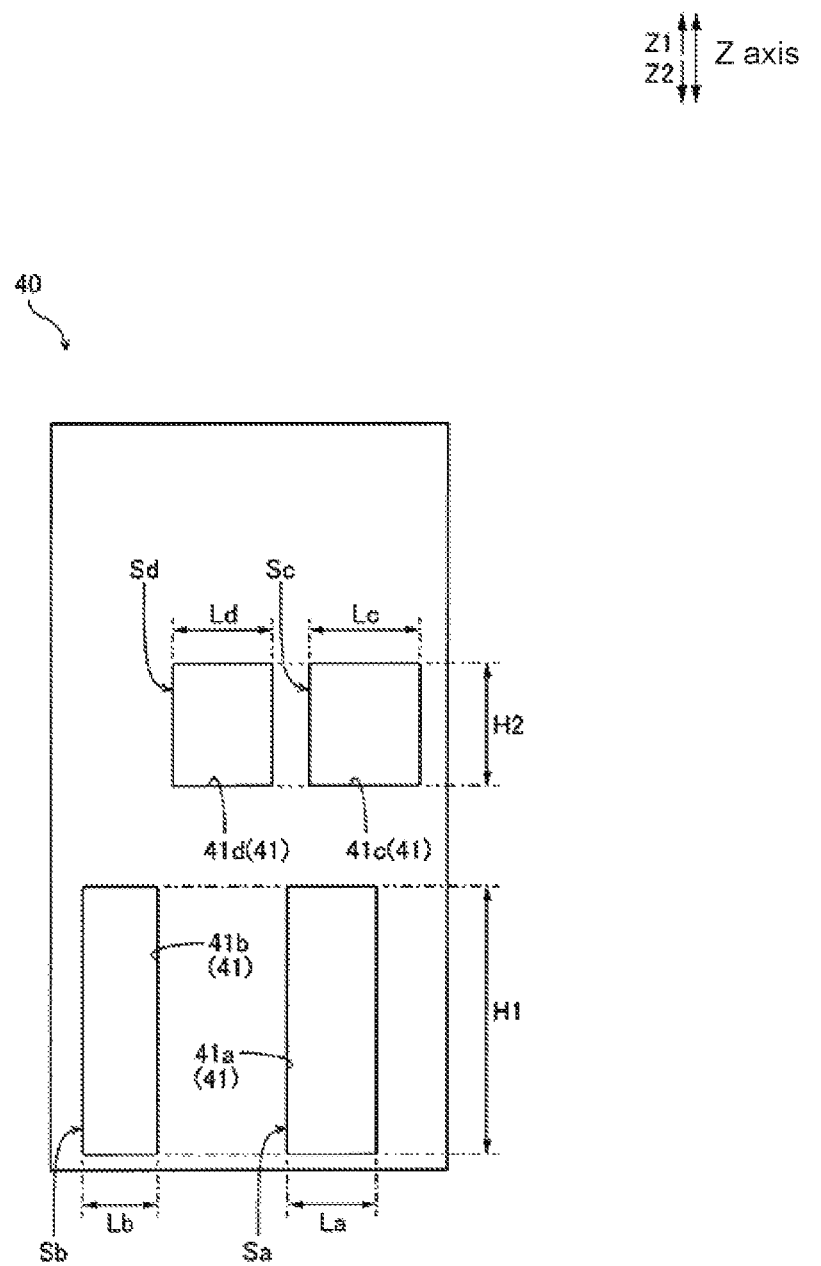
FIG. 5 illustrates the configuration of outlets formed in a partition of the power converter according to the embodiment of the present invention.

Even more specifically, as illustrated in FIG. 5, the outlets 41a and 41b have a height H1 in the up-down direction (Z direction), and the outlets 41c and 41d have a height H2 which is less than the height H1 in the up-down direction (Z direction). In the left-right direction (X direction), the outlets 41a and 41b respectively have a length La and a length Lb which is less than the length La. The outlet 41c and the outlet 41d respectively have a length Lc and a length Ld which is less than the length Lc in the left-right direction (X direction). The area Sa (height H1×length La) of the outlet 41a is greater than the area Sb (height H1×length Lb) of the outlet 41b. The area Sc (height H2×length Lc) of the outlet 41c is greater than the area Sd (height H2×length Ld) of the outlet 41d. The area Sb of the outlet 41b is greater than the area Sc of the outlet 41c. In other words, the areas of the outlets take the following order from smallest to largest: the area Sd of the outlet 41d, the area Sc of the outlet 41c, the area Sb of the outlet 41b, and the area Sa of the outlet 41a.

Moreover, as illustrated in FIG. 2, in the present embodiment the converter 21 and the inverter 22 are configured to be arranged side by side in the left-right direction (X direction) when housed in the component compartment 50, and similarly, the reactor 31 and the reactor 32 are configured to be arranged side by side in the left-right direction (X direction) when housed in the component compartment 50. Therefore, as illustrated in FIG. 4, the outlet 41a and the outlet 41b are formed to be side by side in the left-right direction (X direction), and similarly, the outlet 41c and the outlet 41d are formed to be side by side in the left-right direction (X direction).

Furthermore, as illustrated in FIG. 2, in the present embodiment the radiating fin units 20c are arranged on the heat radiating plates 20b on which the switching devices 20a are installed, and as illustrated in FIG. 4, the radiating fin units 20c are configured to be shorter in the left-right direction (X direction) than in the up-down direction (Z direction) when viewed from the outlet 41 side (Y2 side) after being housed in the component compartment 50. The outlets 41a and 41b corresponding to the switching devices 20a are similarly formed to be shorter in the left-right direction (X direction) than in the up-down direction (Z direction) when viewed from the outlet 41 side (Y2 side) so as to have shapes corresponding to the shapes of the radiating fin units 20c (21c and 22c). More specifically, as illustrated in FIG. 5, the outlets 41a and 41b are formed such that the lengths La and Lb in the left-right direction (X direction) are shorter than the height H1 of the outlets 41*a* and 41*b* in the up-down direction (Z direction). In addition, as illustrated in FIG. 4, in the power converter 100 the outlets 41*a* and 41*b* are configured to respectively overlap with the radiating fin units 21*c* and 22*c* when viewed from the outlet 41 side (Y2 side). More specifically, the radiating fin units 21*c* and 22*c* are respectively exposed by the outlets 41*a* and 41*b*.

Moreover, in the present embodiment the outlets 41 corresponding to the reactors 30 are configured to overlap with the exposed portions of the coils 30*b* when viewed from the outlet 41 side (Y2 side) after the reactors 30 are housed in the component compartment 50. More specifically, the outlet 41*c* is configured to overlap with the portion of the coil 31*b* exposed from the core unit 31*a* when viewed from the outlet 41 side (Y2 side), and the outlet 41*d* is configured to overlap with the portion of the coil 32*b* exposed from the core unit 32*a* when viewed from the outlet 41 side (Y2 side).

As illustrated in FIG. 7, in the present embodiment air-guiding members 90 for guiding cooling air from the reactor 30 side towards the outlet 41 (41*c* and 41*d*) side are formed between the reactors 30 and the outlets 41 (41*c* and 41*d*) corresponding to the reactors 30. More specifically, the partition 40 and the reactors 30 (31 and 32) are arranged to be spaced apart in the front-back direction (Y direction). These air-guiding members 90 are formed on the component compartment 50 side (Y1 side) of the partition 40, near the outlets 41 (41*c* and 41*d*) corresponding to the reactors 30 (31 and 32). The air-guiding members 90 are arranged tilted relative to the Y axis so as to guide cooling air that passes near the coils 30*b* (31*b* and 32*b*) which are the heat-dissipating portions of the reactors 30 (31 and 32) towards the outlets 41 (41*c* and 41*d*). Moreover, when viewed from the top side (Z1 side), the air-guiding members 90 are formed on both sides (the X1 side and X2 side) of the outlet 41*c* (and the outlet 41*d*). Furthermore, the air-guiding members 90 formed on both sides of the outlets 41*c* and 41*d* are arranged such that the spaces therebetween gradually decrease in width going from the Y1 side to the Y2 side (that is, from the upstream side to the downstream side of the flow path taken by the cooling air). In addition, the air-guiding members 90 are made of a paper material such as cardboard.

Figure 8:
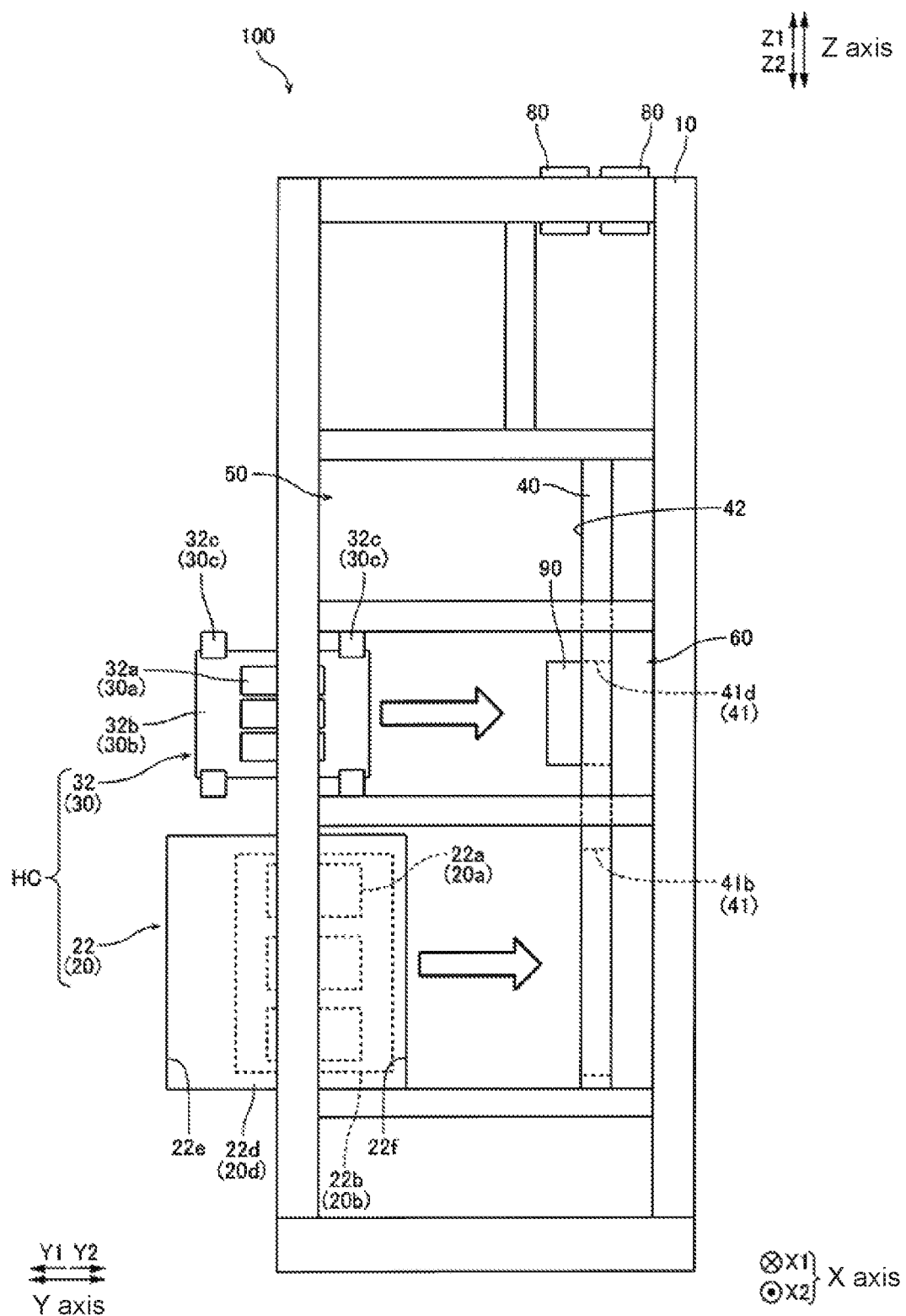
FIG. 8 illustrates how electronic devices are stowed within a component compartment of the power converter according to the embodiment of the present invention.

As illustrated in FIG. 6, in the present embodiment the housings 20*d* of the power conversion unit 20 are configured to contact the partition 40 when housed in the component compartment 50. More specifically, as illustrated in FIG. 8, with the front panel 11 in an open state, the housings 20*d* housing the switching devices 20*a* and the like of the power conversion unit 20 are placed in the component compartment 50 from the front side (Y1 side) of the chassis 10. Then, inside the component compartment 50, the housings 20*d* (21*d* and 22*d*) are slid towards the back side (Y2 side) of the chassis 10 until the duct 60-side (Y2-side) faces 21*f* and 22*f* of the housings 20*d* contact a component compartment 50-side (Y1-side) surface 42 of the partition 40. Thus, inside the component compartment 50 the power conversion unit 20 is positioned contacting the surface 42 of the partition 40.

Furthermore, as illustrated in FIGS. 6 and 7, in the power converter 100 a plurality of beams 12 for supporting electronic devices such as the power conversion unit 20 and the reactors 30 are arranged inside the component compartment 50. The beams 12 are arranged extending in the left-right direction (X direction) of the chassis 10. In the power converter 100, the mounting legs 30*c* on the top sides (Z1 sides) and bottom sides (Z2 sides) of the reactors 30 respectively contact and are fixed to beams 12 arranged on the upper side (Z1 side) and the lower side (Z2 side). The reactors 30 are thus fixed to the chassis 10 in this manner, and the reactors 30 make it possible to improve the strength of the chassis 10 in the up-down direction (Z axis direction).

(Effects of Embodiment)

The present embodiment makes it possible to achieve advantageous effects such as the following.

In the present embodiment as described above, the power converter 100 includes the partition 40 in which the outlets 41 of sizes corresponding to the amounts of heat generated by the heat-generating components HC are formed. Here, the sizes of the outlets 41 formed in the partition 40 are configured to correspond to the amounts of heat generated by the heat-generating components HC, thereby making it possible to appropriately set the flow rate of the cooling air that cools the heat-generating components HC using just the outlets 41 formed in the partition 40, rather than having to provide a member for adjusting the cooling air flow rate separate from the partition 40. This makes it possible to appropriately cool the heat-generating components HC while avoiding both an increase in the number of components and an increase in the complexity of the configuration of the device. Moreover, the cooling air flow rate can be adjusted by adjusting the sizes of the outlets 41 themselves that are formed in the partition 40, and therefore the sizes of the outlets 41 can be adjusted using a process that is relatively simple in comparison to changing the number and size of a large number of slits formed in a slitted plate.

Furthermore, in the present embodiment as described above, the heat-generating components HC include the power conversion unit 20 and the reactors 30, and the areas of the outlets 41 (41*a* and 41*b*) corresponding to the power conversion unit 20 are different from the areas of the outlets 41 (41*c* and 41*d*) corresponding to the reactors 30. Here, the areas of the outlets 41 (41*a* and 41*b*) corresponding to the power conversion unit 20 and the areas of the outlets 41 (41*c* and 41*d*) corresponding to the reactors 30 are different, and therefore the power conversion unit 20 and the reactors 30 (which generate different amounts of heat) can each be appropriately cooled in accordance with the amounts of heat generated thereby.

In addition, in the present embodiment as described above, the power conversion unit 20 includes the converter 21 and the inverter 22, the converter 21 includes the switching device 21*a*, the inverter 22 includes the switching device 22*a* that generates less heat than the switching device 21*a*, and the area of the outlet 41*b* corresponding to the switching device 22*a* is less than the area of the outlet 41*a* corresponding to the switching device 21*a*. Here, the area of the outlet 41*b* corresponding to the switching device 22*a* is less than the area of the outlet 41*a* corresponding to the switching device 21*a*, and therefore the switching device 21*a* and the switching device 22*a* that generates less heat than the switching device 21*a* can each be appropriately cooled in accordance with the amounts of heat generated thereby.

Moreover, in the present embodiment as described above, the reactors 30 include the reactor 31 for the converter 21 and the reactor 32 for the inverter 22, and the area of the outlet 41*d* corresponding to the reactor 32 is less than the area of the outlet 41*c* corresponding to the reactor 31. Here, the amounts of heat generated by the reactor 31 for the converter 21 and the reactor 32 for the inverter 22 respectively correspond to the amounts of heat generated by the switching device 21*a* and the switching device 22*a*. In other words, the amount of heat generated by the reactor 32 is less than the amount of heat generated by the reactor 31. Thus, by setting the area of the outlet 41d corresponding to the reactor 32 to be less than the area of the outlet 41c corresponding to the reactor 31, the reactor 31 and the reactor 32 that generates less heat than the reactor 31 can each be appropriately cooled in accordance with the amounts of heat generated thereby.

Furthermore, in the present embodiment as described above, the converter 21 and the inverter 22 are arranged side by side in the left-right direction (X direction) when housed in the component compartment 50, and the outlet 41a corresponding to the switching device 21a and the outlet 41b corresponding to the switching device 22a are formed in the partition 40 so as to be arranged side by side in the left-right direction (X direction) at positions respectively corresponding to the converter 21 and the inverter 22. Similarly, the reactor 31 and the reactor 32 are arranged side by side in the left-right direction (X direction) when housed in the component compartment 50, and the outlet 41c corresponding to the reactor 31 and the outlet 41d corresponding to the reactor 32 are formed in the partition 40 so as to be arranged side by side in the left-right direction (X direction) at positions respectively corresponding to the reactor 31 and the reactor 32. This makes it possible to arrange the outlets 41 corresponding to the switching device 21a and the switching device 22a (which generate relatively similar amounts of heat) to be side by side in the left-right direction (X direction) in the partition 40, and similarly makes it possible to arrange the outlets 41 corresponding to the reactor 31 and the reactor 32 (which generate relatively similar amounts of heat) to be side by side in the left-right direction (X direction) in the partition 40. This, in turn, makes it possible to use a relatively simple process to form the outlets 41 in the partition 40.

In addition, in the present embodiment as described above, the power conversion unit 20 includes the converter 21 and the inverter 22, the converter 21 includes the switching device 21a and the radiating fin unit 21c for radiating away heat generated by the switching device 21a, and the inverter 22 includes the switching device 22a that generates less heat than switching device 21a as well as the radiating fin unit 22c for radiating away the heat generated by the switching device 22a. The radiating fin unit 21c and the radiating fin unit 22c are configured to be shorter in the left-right direction (X direction) than in the up-down direction (Z direction) when viewed from the side of the outlets 41 (41a and 41b) after being housed in the component compartment 50, and the outlet 41a corresponding to the switching device 21a and the outlet 41b corresponding to the switching device 22a are formed to respectively have a shape corresponding to the shape of the radiating fin unit 21c and a shape corresponding to the shape of the radiating fin unit 22c. Here, the radiating fin unit 21c and the outlet 41a corresponding to the radiating fin unit 21c are both formed to be shorter in the left-right direction (X direction) than in the up-down direction (Z direction), which makes it possible to make the radiating fin unit 21c and the outlet 41a corresponding to the switching device 21a overlap (that is, to expose the radiating fin unit 21c from the outlet 41a corresponding to the switching device 21a) when viewed from the side of the outlet 41a corresponding to the radiating fin unit 21c after the converter 21 including the radiating fin unit 21c is housed in the component compartment 50. Similarly, the radiating fin unit 22c and the outlet 41b corresponding to the switching device 22a are both formed to be shorter in the left-right direction (X direction) than in the up-down direction (Z direction), which makes it possible to make the radiating fin unit 22c and the outlet 41b corresponding to the switching device 22a overlap (that is, to expose the radiating fin unit 22c from the outlet 41b corresponding to the switching device 22a) when viewed from the side of the outlet 41b corresponding to the switching device 22a after the inverter 22 including the radiating fin unit 22c is housed in the component compartment 50. Therefore, cooling air that has cooled the radiating fin unit 21c and cooling air that has cooled the radiating fin unit 22c both take linear flow paths through the component compartment 50 and arrive at the duct 60 in a linear manner. As a result, the flow of the cooling air that has cooled the radiating fin unit 21c and the flow of the cooling air that has cooled the radiating fin unit 22c are less likely to get obstructed, which makes it possible to cool the switching device 21a and the switching device 22a efficiently.

Moreover, in the present embodiment as described above, the reactors 30 include the core units 30a and the coils 30b, with at least portions of the coils 30b being exposed from the core units 30a. The outlets 41 (41c and 41d) corresponding to the reactors 30 are configured to overlap with the exposed portions of the coils 30b when viewed from the outlet 41 side (Y2 side) after the reactors 30 are housed in the component compartment 50. Here, the exposed portions of the coils 30b (which take a relatively high temperature) in the reactors 30 and the outlets 41 (41c and 41d) corresponding to the reactors 30 are linearly aligned going from the component compartment 50 towards the duct 60, and therefore cooling air that has cooled the reactors 30 takes a linear flow path through the component compartment 50 to arrive at the duct 60. As a result, the flow of the cooling air that has cooled the reactors 30 is less likely to get obstructed, which makes it possible to cool the reactors 30 efficiently.

Furthermore, in the present embodiment as described above, the power converter 100 includes the air-guiding members 90 which are formed between the reactors 30 and the outlets 41 (41c and 41d) corresponding to the reactors 30 in order to guide cooling air from the reactor 30 side towards the outlet 41 (41c and 41d) side. Here, even when the reactors 30 are arranged separated from the partition 40 (outlets 41) in order to maintain an insulation distance for the reactors 30, cooling air that has cooled the reactors 30 can be easily guided to the outlets 41 (41c and 41d) by the air-guiding members 90.

In addition, in the present embodiment as described above, the housings 20d of the power conversion unit 20 are configured to contact the partition 40 when housed in the component compartment 50. Here, by sliding the power conversion unit 20 into the component compartment 50 until the housings 20d of the power conversion unit 20 contact the partition 40, the positioning of the power conversion unit 20 is determined by the partition 40. Thus, the power conversion unit 20 can be positioned within the component compartment 50 without having to provide a separate member for positioning the power conversion unit 20 within the component compartment 50, thereby making it possible to avoid an increase in the number of components.

MODIFICATION EXAMPLES

It should be noted that in all respects, the embodiment described above is only an example and does not limit the present invention in any way. The scope of the present invention is defined by the claims, not by the description of the embodiment above. Furthermore, the scope of the present invention also includes all changes (modification examples) made within the scope of the claims and their equivalents. In particular, it is explicitly contemplated that any part or whole of any two or more of the embodiments and their modifications described above can be combined and regarded within the scope of the present invention.

For example, although in the embodiment above the amounts of heat generated by the switching devices 20a and the amounts of heat generated by the reactors 30 were described as being different, the present invention is not limited to this example. The present invention may be configured such that the amounts of heat generated by the switching devices 20a and the amounts of heat generated by the reactors 30 are equal.

Moreover, although in the embodiment above the amount of heat generated by the switching device 22a included in the inverter 22 was described as being less than the amount of heat generated by the switching device 21a included in the converter 21 and the amount of heat generated by the reactor 32 for the inverter 22 was described as being less than the amount of heat generated by the reactor 31 for the converter 21, the present invention is not limited to this example. In the present invention, the amount of heat generated by the switching device 22a included in the inverter 22 may be greater than the amount of heat generated by the switching device 21a included in the converter 21 or may be equal to the amount of heat generated by that switching device 21a. Similarly, the amount of heat generated by the reactor 32 for the inverter 22 may be greater than the amount of heat generated by the reactor 31 for the converter 21 or may be equal to the amount of heat generated by that reactor 31.

Furthermore, although in the embodiment above the converter 21 and the inverter 22 were described as being provided separately and the partition 40 was described as including the outlet 41a corresponding to the switching device 21a included in the converter 21 as well as the outlet 41b corresponding to the switching device 22a included in the inverter 22, the present invention is not limited to this example. In the present invention, a single outlet 41 may be formed corresponding to both of the switching devices 21a and 22a.

In addition, although in the embodiment above the reactor 31 for the converter 21 and the reactor 32 for the inverter 22 were described as being provided separately and the partition 40 was described as including the outlet 41c corresponding to the reactor 31 as well as the outlet 41d corresponding to the reactor 32, the present invention is not limited to this example. In the present invention, a single outlet 41 may be formed corresponding to both of the reactors 31 and 32.

Moreover, although in the embodiment above the heat-generating components HC housed in the component compartment 50 were described as including the power conversion unit 20 and the reactors 30, the present invention is not limited to this example. In the present invention, the heat-generating component may be the power conversion unit 20 alone.

Furthermore, although in the embodiment above the converter 21 and the inverter 22 were described as being configured to be arranged side by side in the left-right direction (X direction) when housed in the component compartment 50, and similarly, the reactor 31 and the reactor 32 were described as being configured to be arranged side by side in the left-right direction (X direction) when housed in the component compartment 50, the present invention is not limited to this example. In the present invention, the converter 21 and the inverter 22 may be shifted relative to one another in the front-back direction (Y direction) or in the up-down direction (Z direction) so as to not be arranged side by side in the left-right direction (X direction) when housed in the component compartment 50. Similarly, the reactor 31 and the reactor 32 may be shifted relative to one another in the front-back direction (Y direction) or in the up-down direction (Z direction) so as to not be arranged side by side in the left-right direction (X direction) when housed in the component compartment 50.

In addition, although in the embodiment above the power conversion unit 20 was described as being configured to include the heat radiating plates 20b, the radiating fin units 20c, and the housings 20d in addition to the switching devices 20a, the present invention is not limited to this example. In the present invention, the components other than the switching devices 20a may be omitted. When omitting the radiating fin units 20c, the switching devices 20a and the outlets 41 may be configured so as to overlap when viewed from the outlet 41 side.

Furthermore, although in the embodiment above the radiating fin units 20c were described as being configured to be shorter in the left-right direction (X direction) than in the up-down direction (Z direction) when viewed from the outlet 41 side (Y2 side) after being housed in the component compartment 50, and similarly, the outlets 41a and 41b corresponding to the switching devices 20a were described as being formed to be shorter in the left-right direction (X direction) than in the up-down direction (Z direction) when viewed from the outlet 41 side (Y2 side) so as to correspond in shape to the radiating fin units 20c, the present invention is not limited to this example. In the present invention, the radiating fin units 20c may be configured to be longer in the left-right direction (X direction) than in the up-down direction (Z direction) when viewed from the outlet 41 side (Y2 side) after being housed in the component compartment 50, and similarly, the outlets 41a and 41b corresponding to the switching devices 20a may be formed to be longer in the left-right direction (X direction) than in the up-down direction (Z direction) when viewed from the outlet 41 side (Y2 side) so as to correspond in shape to the radiating fin units 20c. Moreover, the radiating fin units 20c may be configured to be of equal length in the left-right direction (X direction) and the up-down direction (Z direction) when viewed from the outlet 41 side (Y2 side) after being housed in the component compartment 50, and similarly, the outlets 41a and 41b corresponding to the switching devices 20a may be configured to be of equal length in the left-right direction (X direction) and the up-down direction (Z direction) when viewed from the outlet 41 side (Y2 side) so as to correspond in shape to the radiating fin units 20c. Alternatively, the radiating fin units 20c and the outlets 41a and 41b corresponding to the switching devices 20a may be configured so as to have shapes that do not correspond to one another.

In addition, although in the embodiment above the outlets 41 corresponding to the reactors 30 were described as being configured to overlap with the exposed portions of the coils 30b when viewed from the outlet 41 side (Y2 side) after the reactors 30 are housed in the component compartment 50, the present invention is not limited to this example. In the present invention, the outlets 41 corresponding to the reactors 30 may be configured to not overlap with the exposed portions of the coils 30b when viewed from the outlet 41 side (Y2 side) after the reactors 30 are housed in the component compartment 50. In this case, it is preferable that the tilt of the air-guiding members 90 be adjusted so as to guide cooling air that passes near the coils 30b to the outlets 41.

Moreover, although in the embodiment above the housings 20d of the power conversion unit 20 were described as being configured to contact the partition 40 when housed in the component compartment 50, the present invention is not limited to this example. In the present invention, the housings 20d of the power conversion unit 20 may be configured so as to not contact the partition 40 when housed in the component compartment 50. In this case, it is preferable that a component for positioning the power conversion unit 20 within the component compartment 50 be included.

Furthermore, although in the embodiment above the partition 40 was described as being configured to have a shape that is bent on respective lateral edges when viewed from the up-down direction (Z direction), the present invention is not limited to this example. In the present invention, the partition 40 may have any shape as long as that shape makes it possible to divide apart the component compartment 50 and the duct 60.

What is claimed is:

1. A power converter, comprising:
   a component compartment housing a plurality of heat-generating components;
   a duct communicating with the component compartment for exhausting heat generated by the heat-generating components; and
   a partition arranged between the component compartment and the duct, dividing apart the component compartment and the duct, the partition having a plurality of openings corresponding to the plurality of heat-generating components, respectively, so as to provide air passages from the corresponding heat-generating components to the duct,
   wherein areas of the openings in the partition correspond to amounts of heat generated by the corresponding heat-generating components, respectively,
   wherein at least two of the plurality of heat-generating components have different heat generation amounts from each other, and the areas of the corresponding openings for said at least two of the plurality of heat-generating components are mutually different in accordance with said different heat generation amounts,
   wherein the plurality of heat-generating components include a converter and an inverter,
   wherein the converter includes first switching devices,
   wherein the inverter includes second switching devices,
   wherein the inverter generates less heat than the converter,
   wherein the area of the opening corresponding to the inverter is less than the area of the opening corresponding to the converter,
   wherein the converter further includes a first radiating fin unit for radiating away heat generated by the first switching devices,
   wherein the inverter further includes a second radiating fin unit for radiating away the heat generated by the second switching devices,
   wherein the first radiating fin unit and the second radiating fin unit are shorter in a horizontal direction than in a vertical direction when viewed from a side of the partition, and
   wherein the opening corresponding to the converter has a shape corresponding to a shape of the first radiating fin unit and the opening corresponding to the inverter has a shape corresponding to a shape of the second radiating fin unit.

2. The power converter according to claim 1,
   wherein the plurality of heat-generating components further include a first reactor for the converter and a second reactor for the inverter, and
   wherein the area of the opening corresponding to the second reactor is less than the area of the opening corresponding to the first reactor.

3. The power converter according to claim 2,
   wherein the converter and the inverter are arranged side by side in a horizontal direction in the component compartment,
   wherein the opening corresponding to the converter and the opening corresponding to the inverter are formed in the partition so as to be arranged side by side in the horizontal direction at positions respectively corresponding to the converter and the inverter,
   wherein the first reactor and the second reactor are arranged side by side in the horizontal direction in the component compartment, and
   wherein the opening corresponding to the first reactor and the opening corresponding to the second reactor are formed in the partition so as to be arranged side by side in the horizontal direction at positions respectively corresponding to the first reactor and the second reactor.

4. The power converter according to claim 2,
   wherein each of the first and second reactors includes a core unit and a coil, at least one portion of the coil being exposed from the core unit, and
   wherein the openings corresponding to the first and second reactors overlap with the respective exposed portions of the coils when viewed from a side of the partition.

5. The power converter according to claim 2, further comprising an air-guiding member that is arranged between each of the first and second reactors and the corresponding opening in order to guide cooling air from the first and second reactors towards the corresponding openings, respectively.

6. The power converter according to claim 2, wherein the area of the opening corresponding to the first reactor is less than the area of the opening corresponding to the inverter.

7. The power converter according to claim 1, wherein each of the inverter and the converter has a housing that is in contact with the partition.

* * * * *